(12) United States Patent
Zhang et al.

(10) Patent No.: US 10,325,056 B1
(45) Date of Patent: Jun. 18, 2019

(54) FAILURE BOUNDARY CLASSIFICATION AND CORNER CREATION FOR SCALED-SIGMA SAMPLING

(71) Applicant: Cadence Design Systems, Inc., San Jose, CA (US)

(72) Inventors: Wangyang Zhang, Allison Park, PA (US); Hongzhou Liu, Sewickley, PA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/179,087

(22) Filed: Jun. 10, 2016

(51) Int. Cl.
G06F 17/50 (2006.01)

(52) U.S. Cl.
CPC ...... *G06F 17/5081* (2013.01); *G06F 17/5009* (2013.01)

(58) Field of Classification Search
CPC .................................................. G06F 17/5009
See application file for complete search history.

(56) References Cited

U.S. PATENT DOCUMENTS

| | | | | |
|---|---|---|---|---|
| 2007/0220455 A1* | 9/2007 | Joshi | .................. | G06F 17/5036 716/56 |
| 2011/0153272 A1* | 6/2011 | Tiwary | ............... | G01R 31/2894 702/181 |
| 2012/0046929 A1* | 2/2012 | Joshi | .................. | G06F 17/5022 703/13 |
| 2016/0224705 A1* | 8/2016 | Joshi | .................. | G06F 17/5009 |

OTHER PUBLICATIONS

Sun et al., Fast Statistical Analysis of Rare Circuit Failure Events via Scaled-Sigma Sampling for High-Dimensional Variation Space, IEEE TCAD, vol. 34, No. 7, pp. 1096-1109, Jul. 2015.

* cited by examiner

*Primary Examiner* — Vuthe Siek
(74) *Attorney, Agent, or Firm* — Tarolli, Sundheim, Covell & Tummino LLP

(57) ABSTRACT

A system, methods, and a computer program product for estimating a yield and creating corners of a circuit design with the aid of a failure boundary classification. The system, methods and computer program product provide for determining, based on how many sampling factors have failures, whether data samples are sufficient as input to scaled-sigma sampling. If the data samples are insufficient, the failure boundary classification is usable to determine whether the yield is high enough to meet a yield target. A design corner can be located by applying a binary search to results of scaled-sigma sampling. The failure boundary classification can aid in setting up the search.

20 Claims, 9 Drawing Sheets

FAILURE BOUNDARY CLASSIFICATION AND CORNER CREATION FOR SCALED-SIGMA SAMPLING

FIELD OF THE INVENTION

This description relates to the field of integrated circuit design, more specifically to the use of scaled-sigma sampling in integrated circuit simulations.

BACKGROUND

Integrated circuit design aims not only to create a nominal circuit design that meets a set of predetermined specifications, but also to ensure that the circuit design can be manufactured reliably. Numerous sources of variation may cause some instances of a completed circuit design (e.g., fully simulated or fabricated microchips) to fail, that is, to not achieve at least one of the predetermined design specifications. Quite often, "testing" actually refers to full simulation prior to actual fabrication; that nomenclature is adopted in this description for simplicity. Designers therefore seek to model such variation to estimate and reduce the susceptibility of manufactured designs to such failure.

Designers often find it helpful to design against a set of "design corners" (also known as process corners or simply corners), which are combinations of parameters that lead to a specified variation in the circuit performance measures. The variation is often expressed as a number (k) of standard variations (sigma or σ). The number k is around 3 for most applications, but can be as high as 4-6 in applications where high yield is desired, such as medical and automotive applications, or when the circuit is highly repetitive, with numerous instances of the circuit inside the same chip. Such corners may help a designer determine the workable ranges for design parameters, from which more detailed design refinements may be made.

Scaled-sigma sampling (SSS) is a high yield estimation technique described in Sun et. al., "Fast statistical analysis of rare circuit failure events via scaled-sigma sampling for high-dimensional variation space," IEEE TCAD, vol. 34, no. 7. pp. 1096-1109, Jul. 2015. SSS involves the scaling up of the variation of all process parameters by a factor (s) in order to increase the failure rate, thereby generating a sufficient number of failure samples for analysis. This enables estimates to be made in high yield situations, where the number of failures is statistically low. FIG. 1 is a graph illustrating the effects of sigma scaling. FIG. 1 includes example failure rate curves for scaling values of 1 and 2 as a function of x, where x is a process parameter. A failure region 50 is defined based on a performance target. As evident, the failure rate increases with scaling value.

The inventors have discovered that SSS has certain drawbacks including reduced accuracy for strongly non-linear failure boundaries (e.g., super-linear or sub-linear), no meaningful results when the yield is extremely high (insufficient number of failures despite sigma scaling), and no ability to create corners.

DESCRIPTION OF EMBODIMENTS

Figure 1:
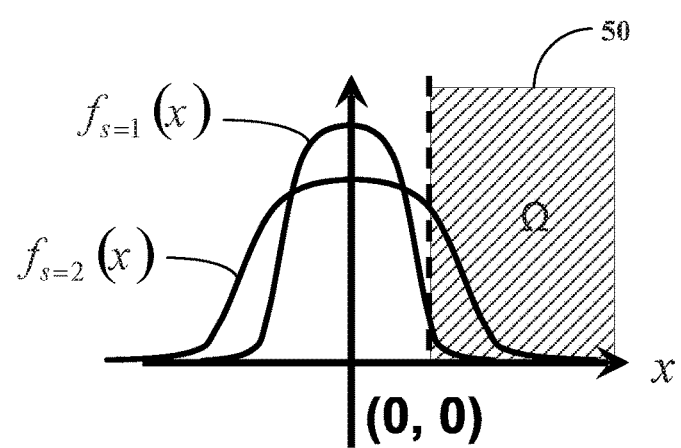
FIG. 1 is a graph illustrating example failure rate curves as a function of scaling value.

The present description relates to a system, methods, and a computer program product for failure boundary classification and corner creation in connection with SSS. Although this description is written in terms of integrated circuit design, the invention is not limited to that application, but may be applicable to any statistically characterized process to identify design failures. The methods enhance performance and efficiency of a design verification system in which the methods are employed. Designs surviving the verification process may then be translated into manufacturable descriptions of circuits, ultimately for physical fabrication of those circuits.

SSS models failure rate (P) as a function of the scaling factor s, using three model coefficients ($\alpha$, $\beta$, $\gamma$). With the general assumption that within a failure region ($\Omega$), there exists a much smaller subset of $T_0$ hyper-rectangles with similar small distance to origin, it can be derived that the failure rate satisfies the following formula:

$$\log(P) \approx \alpha + \beta \log(s) + \gamma/s^2$$

where $$\alpha = \log\left[\Delta x / (\sqrt{2\pi})^M\right] + \log(T_0)$$

$$\beta = -M$$

$$\gamma = \max_{k \in \Omega} \left[-\|x^{(k)}\|_2^2 / 2\right]$$

M is the total number of random variables (e.g., process parameters).

The failure rate model has few constraints on the failure region and, in fact, can target multiple failure regions. To estimate the failure rate, Monte Carlo simulations are first performed on several large scaling factors for which failures are more easily observed; the model coefficients $\alpha$, $\beta$ and $\gamma$ are then fitted by linear regression; finally, P is extrapolated based on the model so that the actual failure rate is $$P(s=1)=\exp(\alpha+\gamma)$$

In order to improve upon SSS (the main algorithm for which produces a yield estimate according to the above discussion of the failure rate formula), two methods are proposed. The first method is performed before applying the main SSS algorithm, involves classifying the failure boundary and, depending on the results of the classification, may involve performing additional pre-processing or determining that the yield problem cannot be solved through application of SSS on the existing sample set. The second method is performed using the results of the main SSS algorithm and provides for extraction of a k-sigma corner using a binary search. Both methods will be explained in detail.

Embodiments of the present invention may determine whether a failure boundary is linear, super-linear or sub-linear. Depending on the results of this boundary classification and on whether there exist a sufficient number of sampling factors with failures, various steps may be taken. SSS may be performed as usual, samples associated with large scaling values may be eliminated from consideration as input for SSS analysis, or SSS may be omitted altogether because the yield is extremely high or the problem has been determined to be unsolvable given the present sample set.

Embodiments of the present invention may efficiently extract design corners that define where design instances fail to meet a particular design specification at a specified variation level, often stated in k-sigma terms. A binary search may be performed by comparing yield results from SSS (e.g., in y-sigma terms) to a k-sigma target (e.g., six-sigma), adjusting the upper or lower bounds of a performance target (t) based on the comparison, and applying SSS to solve for they value that corresponds to t. The search terminates when y is sufficiently close to k, and the t value corresponding toy is selected as a final or best target. A corner is then identified by iterating over design points previous run by SSS to locate a point sufficiently close to the final target. No additional simulations on top of those already performed by SSS are required in order to identify the corner.

Figure 2:
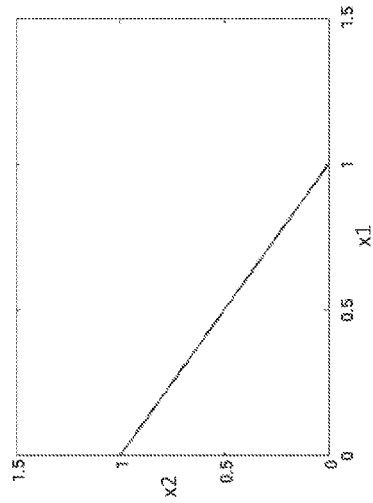
FIG. 2 is a graph of an example super-linear boundary for a two-dimensional parameter space.
Figure 3:
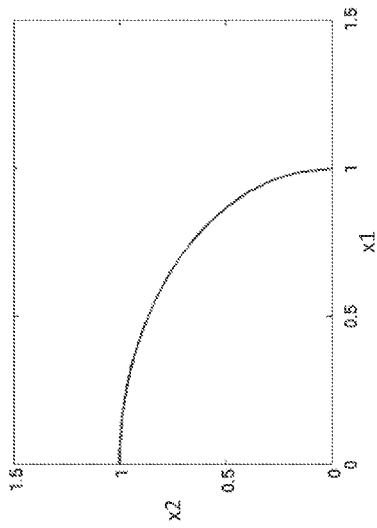
FIG. 3 is a graph of an example linear boundary for a two-dimensional parameter space.
Figure 4:
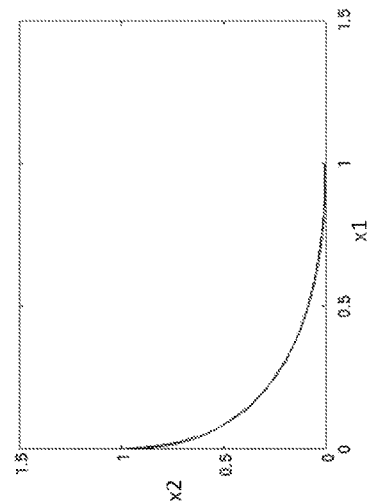
FIG. 4 is a graph of an example sub-linear boundary for a two-dimensional parameter space.

FIG. 2 is a graph of an example super-linear boundary for a two-dimensional parameter space comprising parameters x1 and x2. For comparison, FIG. 3 is a graph of an example linear boundary and FIG. 4 is a graph of an example sub-linear boundary. In FIG. 2, the failure rate increases at a significantly faster rate with scaling, relative to the failure rate in FIG. 3. In FIG. 4, the failure rate increases at a slower rate relative to FIG. 3.

Figure 5:
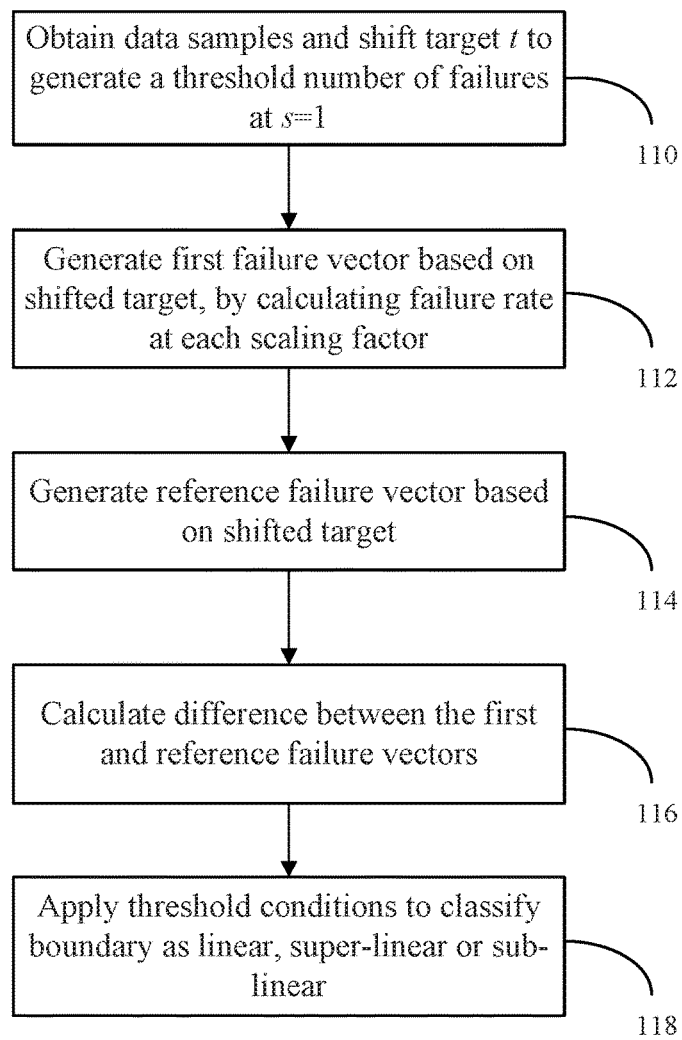
FIG. 5 shows an embodiment of a method for boundary classification.

FIG. 5 shows an embodiment of a method 100 for boundary classification. The method may be performed prior to performing a yield estimate using SSS, i.e., prior to executing the main SSS algorithm. At step 110, data samples that will later be used as input for SSS are obtained, and the performance target t is shifted in order to generate a threshold number of failures in the data samples (the shifting is for boundary classification purposes. For yield estimate purposes, SSS is performed using the original, un-shifted performance target). For example, if the performance target is a delay of a memory circuit, t may be reduced iteratively until there are at least ten failures at s=1. The threshold number of failures need not be fixed at ten and may instead be set to any positive number.

At step 112, a first failure vector $f=[f_1, f_2, \ldots, f_M]$ is generated based on the shifted target and for various scaling factors (e.g., s=1, s=2, s=3, etc.). Here, M is the total number of scaling factors. Thus, the first failure vector includes a failure rate for each scaling factor.

At step 114, a reference failure vector is generated based on the shifted target and for the same set of scaling factors as the first failure vector. The reference failure vector may be generated assuming a linear model, which will have a normal distribution $N(\mu, \sigma)$, where $\mu$ is the mean of the samples. When sigma is scaled by $s_i$, the distribution becomes $N(\mu, (s_i\sigma)^2)$, so that the failure rate at $s_i$ can be estimated by $$f_{ref,i} = \frac{1}{2}\left(1 - \text{erf}\left(\frac{t-\mu}{\sigma \cdot s_i \cdot \sqrt{2}}\right)\right)$$

where erf is the error function, also known as the Gauss error function.

At step 116, a difference between the first and reference failure rate vectors is calculated, e.g., by applying the following difference function $$\text{diff} = \frac{\|f - f_{ref}\|_2}{\|f_{ref}\|_2}$$

At step 118, threshold conditions are applied to classify the boundary as linear, super-linear or sub-linear. As a first condition, the magnitude of the difference may be evaluated against a difference threshold. As a non-limiting example, if the difference is less than 10%, the boundary may be considered linear. On the other hand, if the difference is 10% or more, then the boundary may be considered super-linear or sub-linear.

If the difference is greater than the threshold, a second threshold condition may be applied in order to distinguish between super-linear and sub-linear boundaries. The second threshold condition may be based on whether most of the elements (e.g., more than 50%) in f are larger than their corresponding elements in $f_{ref}$. That is, $f_1$ is compared to $f_{ref,1}$ and $f_2$ is compared to $f_{ref,2}$, etc. If most of the elements in f are larger, then the boundary may be classified as super-linear. However, if most of the elements in f are smaller, then the boundary may be classified as sub-linear. Thus, the threshold conditions are summarized by the following rules: (1) If the difference is large and most elements in f are larger than $f_{ref}$, classify the boundary as super-linear. (2) If the difference is large and most elements in f are smaller than $f_{ref}$, classify the boundary as sub-linear. (3) If the difference is small, classify the boundary as linear.

Figure 6:
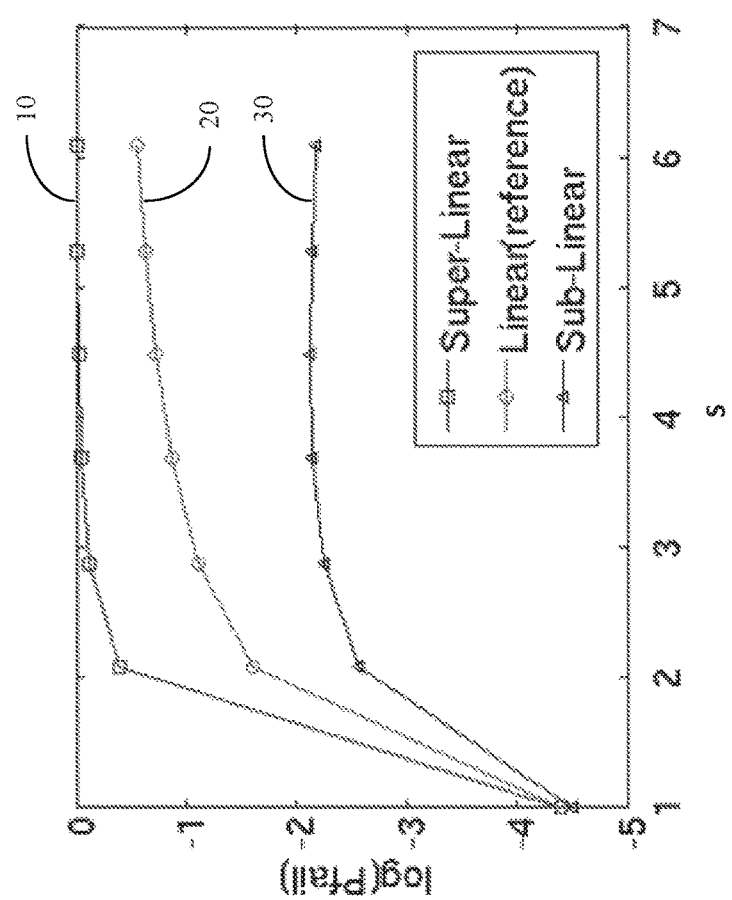
FIG. 6 is a failure rate graph for example super-linear, linear, and sub-linear boundaries.

FIG. 6 is a graph of failure rate ($P_{fail}$) as a function of s for example super-linear, linear, and sub-linear boundaries, the failure rate curves being respectively labeled 10, 20 and 30. The differences between the failure rates are reflected in the above noted rules. For example, comparing the super-linear failure curve 10 to the linear failure curve 20, it is apparent that for most of the scaling points, the failure rate in super-linear failure curve 10 is significantly greater than the corresponding failure rate in the linear failure curve 20.

Figure 7:
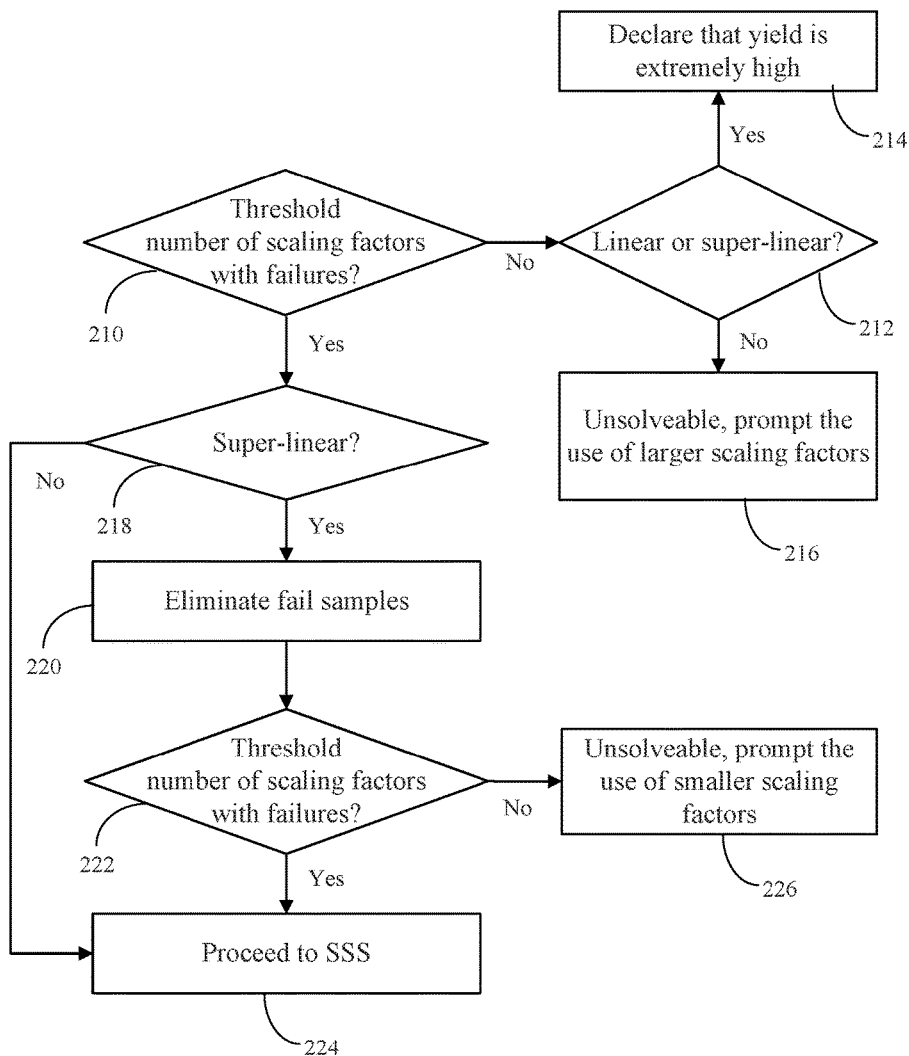
FIG. 7 shows an embodiment of a method for applying the results of boundary classification.

Although the boundary classification is useful information in itself, the boundary classification can also be applied to improve upon the accuracy of the SSS algorithm or to determine whether the yield is high even when the SSS algorithm is incapable of providing a solution to the yield problem. FIG. 7 shows an embodiment of a method 200 for applying the results of boundary classification. The method 200 may be treated as an extension of the method 100. However, alternative methods for boundary classification may potentially be used in combination with the method 200.

Figure 8:
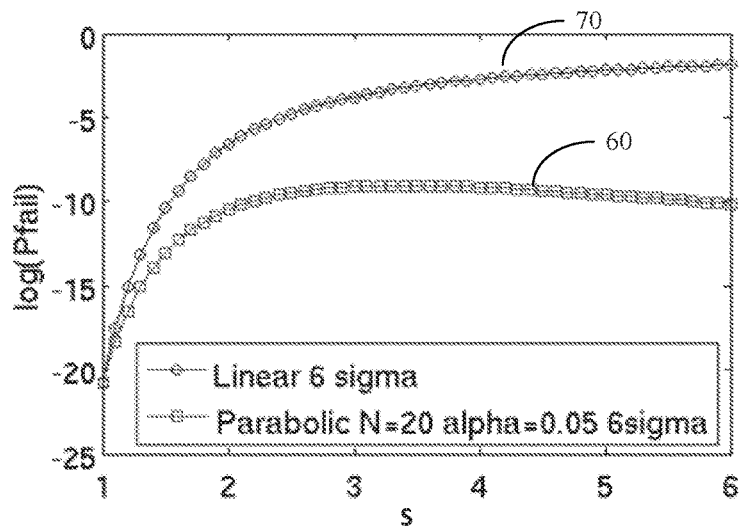
FIG. 8 is a failure rate graph for an example sub-linear boundary.

At step 210, it is first determined whether a threshold number of scaling factors with failures exist in the data samples, i.e., determining whether there are any failures at s=1, s=2, s=3, etc. and counting how many scaling factors have failures. In an embodiment, the threshold number of scaling factors with failures is three, since at least three sets of data associated with failures are needed to solve for the three unknown model coefficients α, β and γ. However, it is possible to require more than three scaling factors with failures. If the threshold number of scaling factors with failures is not met, then boundary classification may be used to determine whether yield is extremely high. Intuitively, if failures cannot be observed even when very large scaling factors are applied, it may be inferred that the yield is very high and certainly far above a typical yield target (<=6 sigma). However, one exception to this inference can happen for some sub-linear cases where the yield is simply not sensitive to scaling, i.e., the yield changes little in response to scaling. An example is illustrated in FIG. 8, which shows a failure rate curve 60 experimentally produced by applying SSS to 1000 data points, for a sub-linear test case where the actual yield is 6-sigma, even though the number of failures is zero at any scaling factor. A failure rate curve 70 for a linear boundary is shown for comparison. Therefore, it is sometimes possible to declare, even without verifying the exact value using SSS, that the yield is very high, but only if the boundary is linear or super-linear. In such situations, the user would know that the yield target is satisfied. Accordingly, a determination is made at step 212 whether the boundary is linear or super-linear. If so, then it is declared that the yield is extremely high, e.g., high enough to meet a specified yield target within the typical range of <=6 sigma (step 214).

If it is determined from step 212 that the boundary is sub-linear, then the problem is unsolvable and the user may be prompted to rerun SSS with larger scaling factors (step 216).

If the threshold number of scaling factors with failures is met, the method may proceed to step 218, where it is determined whether the boundary is super-linear. If the boundary is not super-linear, then the method proceeds to the main SSS algorithm at step 224. However, if the boundary is super-linear, an additional processing step (220) is performed. Step 220 prepares data associated with super-linear boundaries for the main SSS algorithm by eliminating samples for any scaling factor $s_i$ where the failure rate does not increase significantly compared to the previous scaling factor $s_{i-1}$. As a non-limiting example, an increase of 10% or more may generally be considered significant. However, it is understood that what is significant at one scaling factor may not be significant at another scaling factor, since the failure rate increases rapidly with s when the boundary is super-linear.

Figure 9:
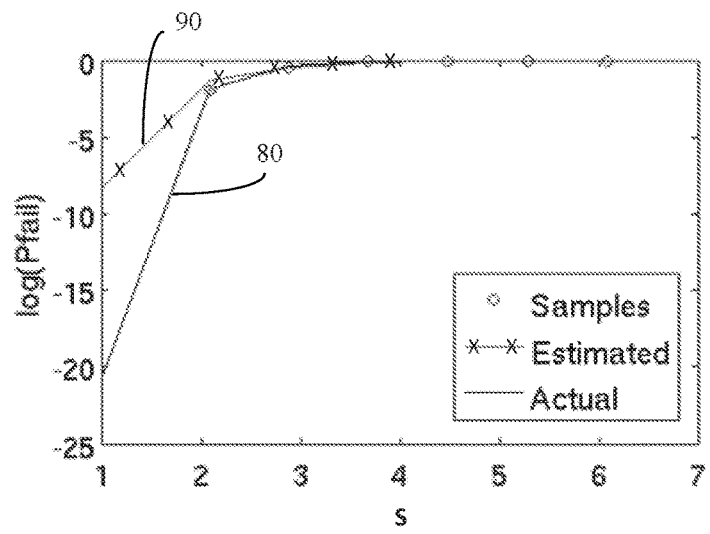
FIG. 9 is a failure rate graph for an example super-linear boundary.

FIG. 9 is an experimentally produced graph of failure rate versus s for a super-linear boundary. The actual failure rate is shown as curve 80, while the failure rate estimated using SSS is shown as curve 90. It is apparent that the failure rate at s=1 is overestimated. Step 220 addresses this problem by eliminating from consideration by SSS any samples where the super-linear failure characteristics are not readily apparent when comparing the present scaling factor to the immediately preceding scaling factor. As shown in FIG. 9, later scaling factors (higher s value) tend to satisfy this removal criterion. If the SSS algorithm is applied after removing samples associated with such scaling factors, then the yield estimate for s=1 will be much closer to the actual rate. The method then proceeds to step 222.

At step 222, it is determined again whether a threshold number of scaling factors with failures exists in the data samples. The threshold for step 222 may be the same as that for step 210, e.g., at least three scaling factors with failures. If the threshold number of scaling factors with failures is met, then there is sufficient data for SSS at step 224. If the threshold is not met, then the problem is unsolvable, and the user may be prompted to rerun SSS with smaller scaling factors (step 226).

Figure 10:
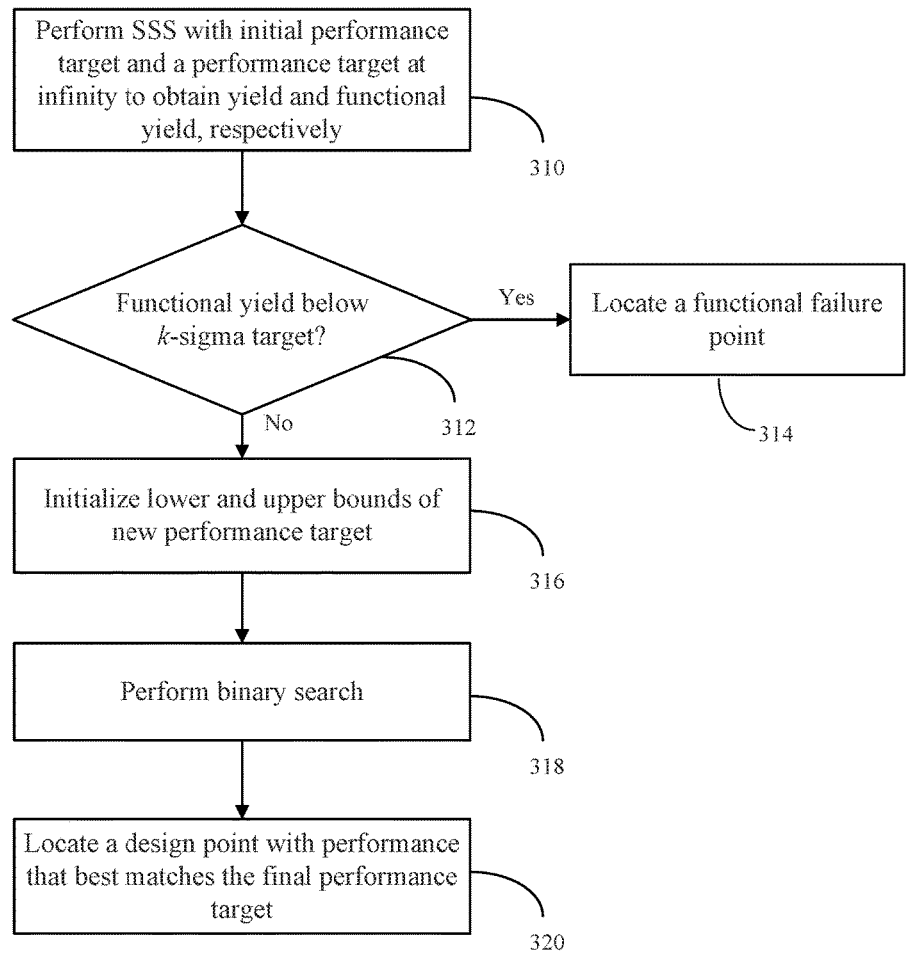
FIG. 10 shows an embodiment of a method for creating a corner.

FIG. 10 is an embodiment of a method 300 for creating a corner. At step 310, SSS is performed using an initial performance target (t) to produce a yield estimate (y). SSS is also performed using a target at infinity to produce a functional yield estimate ($y_f$).

At step 312, it is determined whether $y_f$ is below the target sigma value (k). If so, then the method proceeds to 314, where the sample data is searched to locate a functional failure point as the k-sigma corner.

If $y_f$ is not below k, then a binary search is initiated to search for a best performance target ($t_{best}$) from among candidate targets located between a lower bound ($t_l$), with yield ($y_l$) and (best, an upper bound ($t_u$), with yield ($y_u$). The lower and upper bounds may be initialized (step 316) based on the following rules:

1) If y>k, the lower bound is the Monte Carlo sample mean u, and the upper bound is the initial performance target t 2) If y<k, the lower bound is t, and the upper bound is tentatively set to $t_u$=u+m*s, where s is the Monte Carlo sample standard deviation and m is some large number. The yield $y_u$ is then estimated via SSS for the tentative $t_u$. As a non-limiting example, m can be 10 for typical yield targets less than or equal to 6 sigma.

The tentative $t_u$ is used as the upper bound if any of the following conditions exists: i) $y_u$>k, ii) $t_u$ has a very high yield (insufficient number of scaling factors with failures and boundary is linear or super-linear) or iii) $t_u$ gives rise to a sub-linear unsolvable problem (e.g., as determined using the earlier described methods 100 and 200). In this manner, boundary classification may aid in setting up the binary search. However, if either of the following conditions exists: iv) $y_u$<k or v) $t_u$ gives rise to a super-linear unsolvable problem, then the tentative $t_u$ will not be used as the upper bound. Instead, the upper bound may be found by applying an iterative procedure, in which the value of m is increased (e.g., doubled), $t_u$ is again tentatively set using the formula above, and SSS is applied to solve for $y_u$ until $y_u$ becomes greater than k:

while not $y_u$>k $m=2*m$ $t_u=u+m*s$

Apply SSS to solve $y_u$ end

At step 318, the binary search may be performed after the lower and upper bounds are initialized. The best performance target $t_{best}$ may be defined as the best target with yield $y_{best}$ best closest to k. $t_{best}$ and $y_{best}$ best may be initialized as:

$$\begin{cases} t_{best} = t_l, y_{best} = y_l & \text{if } |t_l - k| < |t_u - k| \\ t_{best} = t_u, y_{best} = y_u & \text{otherwise} \end{cases}$$

Additionally, because the binary search may not always converge to an exact target, the search may be limited to a maximum number of iterations (maxIter). The binary search may therefore be defined according to the following algorithm:

```
iter=0
while iter<maxIter
    t=(t_l+t_u)/2
    Apply SSS to solve y corresponding to t
    if |y-k|<|y_best-k|
        y_best=Y,t_best=t
        if y_best is sufficiently close to k, stop
    end
    if (y>k) or (y is very high) or (t is a sub-linear
        unsolvable problem)
        t_u=t
    else
        t_l=t
    end
    iter=iter+1
end
```

A test for $y_{best}$ being sufficiently close to k may be based on a fixed threshold difference (e.g., $|y_{best}-k|$ less than 0.05). Alternatively, the threshold for closeness may vary depending on the value of k. For example, if k=6, then $y_{best}$ in the range of 5.9-6.1 may be sufficient (difference equals 0.1 or less). On the other hand, if k is a lower value, e.g., k=4, then the range of acceptable $y_{best}$ values could be narrower, e.g., 3.95-4.05 (difference equals 0.05 or less).

When the binary search is finished, the final value of $t_{best}$ is used to locate the corner at step 320, where the design points previously run by SSS are searched to locate a point that is closest to $t_{best}$, e.g., some combination of design parameters that produces performance closer to $t_{best}$ compared to all other combinations of design parameters or, alternatively, the first combination of design parameters that is found to produce performance sufficiently close to $t_{best}$ (the requisite closeness may vary, e.g., depending on the performance parameter in question). The located point corresponds to the k-sigma corner.

Figure 11:
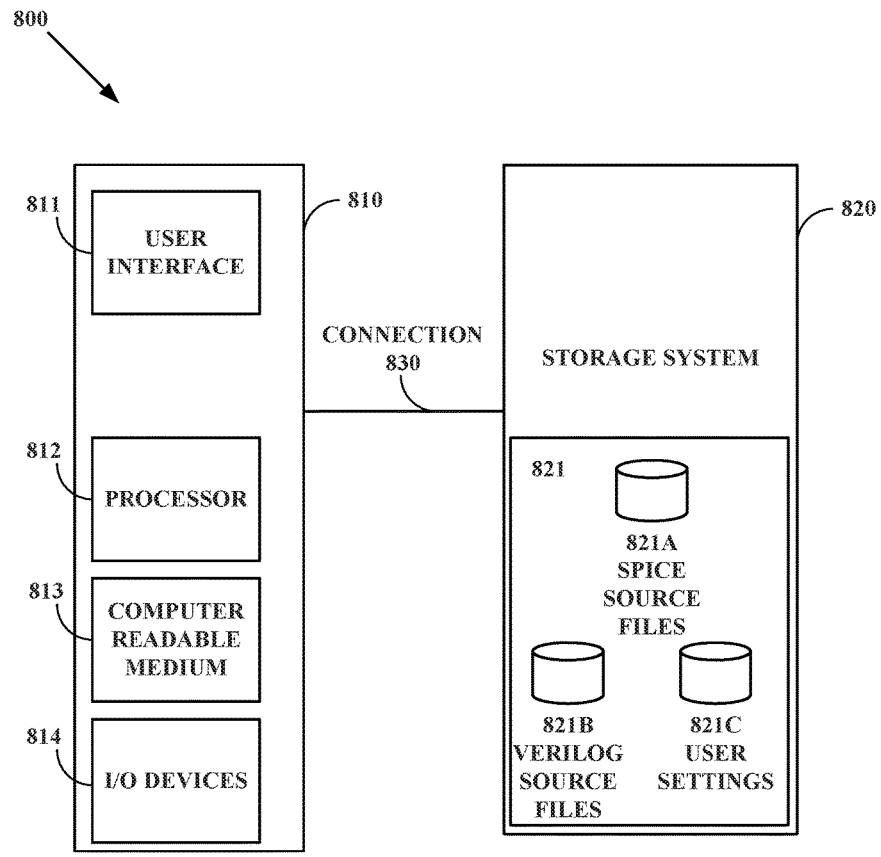
FIG. 11 shows a block diagram of an exemplary circuit analysis system.

FIG. 11 shows a block diagram of an exemplary circuit analysis system 800, according to an embodiment. This system may provide simulator functionality for any of the methods described above. A user may access the system 800 through a standalone client system, client-server environment, or a network environment. System 800 may comprise one or more clients or servers 810, one or more storage systems 820, and a connection or connections 830 between and among these elements.

Client 810 may execute instructions stored on transitory or non-transitory computer readable medium 813 with processor 812, and may provide a user interface 811 to allow a user to access storage system 820. The instructions may be part of a software program or executable file that may operate electronic design automation (EDA) software. Client 810 may be any computing system, such as a personal computer, workstation, mobile computer, or other device employing a processor which is able to execute programming instructions. User interface 811 may be a graphical user interface (GUI) run in a user-controlled application window on a display. A user may interact with user interface 811 through one or more input/output (I/O) devices 814 such as a keyboard, a mouse, or a touch screen.

Storage system 820 may take any number of forms, including but not limited to a server with one or more storage devices attached to it, a storage area network, or one or a plurality of non-transitory computer readable media.

Databases 821 may be stored in storage system 820 such that they may be persistent, retrieved, or edited by the user. Databases 821 may include SPICE source files 821A, Verilog source files 821B, and a user input database 821C for example. These databases may be kept as separate files or systems, or may be merged together in any appropriate combination.

Only one client 810 is shown connected to storage system 820 through connection 830, which may be a simple direct wired or wireless connection, a system bus, a network connection, or the like, to provide client 810 with access to storage system 820. In another aspect, connection 830 may enable multiple clients 810 to connect to storage system 820. The connection may be part of a local area network, a wide area network, or another type of network, again providing one or more clients with access to storage system 820. Depending on system administrator settings, client 810's access to system storage 820 or to other clients may be limited.

Figure 12:
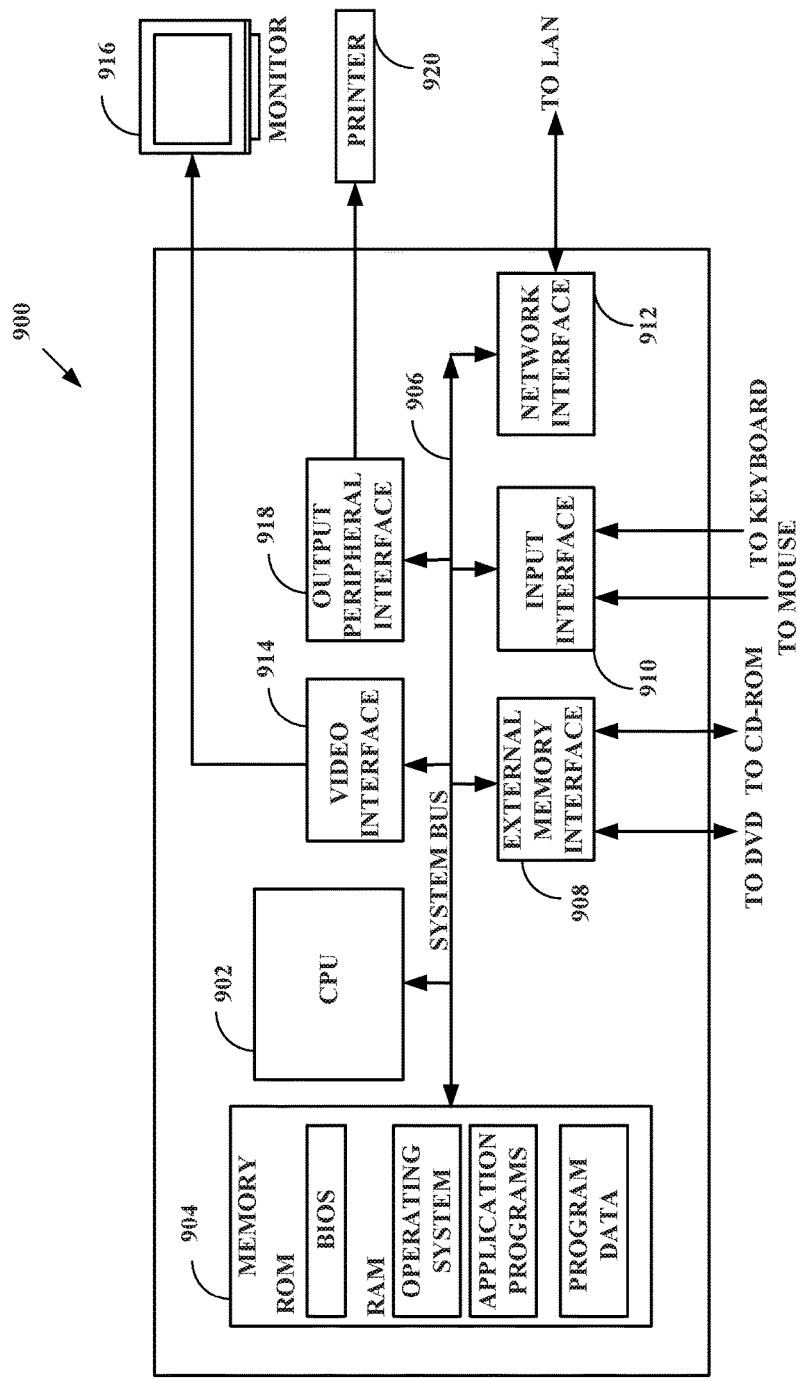
FIG. 12 shows an example computer system for implementation of various described embodiments.

FIG. 12 depicts an exemplary computer system 900 comprising the structure for implementation of embodiments described above. Computer system 900 comprises a central processing unit (CPU) 902 that processes data stored in memory 904 exchanged via system bus 906. Memory 904 typically includes read-only memory, such as a built-in operating system, and random-access memory, which may include an operating system, application programs, and program data. Computer system 900 also comprises an external memory interface 908 to exchange data with a DVD or CD-ROM for example. Further, input interface 910 may serve to receive input from user input devices including but not limited to a keyboard and a mouse. Network interface 912 may allow external data exchange with a local area network (LAN) or other network, including the internet. Computer system 900 also typically comprises a video interface 914 for displaying information to a user via a monitor 916. An output peripheral interface 918 may output computational results and other information to output devices including but not limited to a printer 920.

Computer system 900 may comprise for example a personal computer or an engineering workstation, each of which is widely known in the art and is commonly used for integrated circuit design tasks, along with software products commercially available for performing computer-aided integrated circuit design tasks. Computer system 900 may also comprise a mobile computer, including for example a tablet computer or a smart phone. The computer system of FIG. 12 may for example receive program instructions, whether from existing software products or from embodiments of the present invention, via a computer program product and/or a network link to an external site.

The description of the foregoing embodiments may refer to algorithms, sequences, macros, and operations that require processor execution of instructions stored in memory. One or more processors may collectively or individually execute a computer program stored in memory. Memory may include a non-transitory computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices may be further connected to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. For instance, steps illustrated in the flowcharts may be omitted and/or certain step sequences may be altered, and, in certain instances multiple illustrated steps may be simultaneously performed. Thus, it is intended that the specification and examples be considered as exemplary only, with a true scope of the present disclosure being indicated by the following claims and their equivalents.

What is claimed is:

1. A processor implemented method for generating a yield estimate and extracting corners for a circuit design, the method comprising:
   comparing, by a processor of a computer, a first set of failure rate data to a reference set of failure rate data, wherein each of the first set of failure rate data and the reference set of failure rate data includes failure rates for the circuit design at different scaling factors;
   classifying, by the processor, a failure boundary based on the comparing, wherein the failure boundary is classified as one of linear, super-linear, and sub-linear;
   upon determining that the failure boundary is classified as super-linear, eliminating, with the processor, a set of data samples for scaling factors where a failure rate does not increase significantly compared to a previous scaling factor;
   selectively performing, with the processor, a scaled-sigma sampling on a remaining set of data samples, wherein sufficiency for the remaining set of data samples as input to the scaled-sigma sampling is based on (i) whether a threshold number of scaling factors have failures in the remaining set of data samples and (ii) the failure boundary classification, in which the scaled-sigma sampling produces the yield estimate for the circuit design;
   if the remaining set of data samples is insufficient, determining, by the processor, whether a yield is high enough to meet a yield target based on (i) a threshold number of the scaling factors not having failures and (ii) the failure boundary being classified as one of linear or super-linear; and
   extracting, with the processor, corners associated with design instances that fail to meet a particular design specification based on the yield estimate and the yield target.

2. The method of claim 1, further comprising:
   generating the first set of failure rate data and the reference set of failure rate data from the data samples by shifting a performance target such that a threshold number of failures occur at sigma equals one.

3. The method of claim 1, further comprising:
   generating the reference set of failure rate data from the data samples based on a linear model.

4. The method of claim 3, wherein the comparing includes computing a difference between the first set of failure rate data and the reference set of failure rate data, and wherein the failure boundary is classified based on the difference.

5. The method of claim 4, wherein the failure boundary is classified as super-linear if the difference is large and most elements in the first set of failure rate data are larger than their corresponding elements in the reference set of failure rate data.

6. The method of claim 4, wherein the failure boundary is classified as sub-linear if the difference is large and most elements in the first set of failure rate data are smaller than their corresponding elements in the reference set of failure rate data.

7. The method of claim 1, further comprising:
   if the failure boundary is super-linear, eliminating data samples for scaling factors where a failure rate does not increase significantly compared to a previous scaling factor.

8. The method of claim 1, wherein the corner extraction includes:
   performing a binary search to locate a best performance target for a specified sigma value for corner creation, wherein scaled-sigma sampling is applied to estimate yields corresponding to candidate performance targets, wherein the binary search terminates when an estimated yield is sufficiently close to the specified sigma value, and wherein the best performance target is the candidate performance target at termination of the binary search.

9. The method of claim 8, further comprising:
   initializing upper and lower bounds of the binary search based on a yield estimate obtained by applying scaled-sigma sampling using an initial performance target.

10. The method of claim 8, further comprising:
    identifying a design corner by locating a design point with performance that best matches the best performance target.

11. A system for generating a yield estimate and extracting corners for a circuit design, the system comprising:
    a non-transitory memory storing executable instructions; and
    one or more processors executing the instructions, wherein the instructions cause the one or more processors to:
      compare a first set of failure rate data to a reference set of failure rate data, wherein each of the first set of failure rate data and the reference set of failure rate data includes failure rates for the circuit design at different scaling factors;
      classify a failure boundary based on the comparing, wherein the failure boundary is classified as one of linear, super-linear, and sub-linear;
      selectively perform a scaled-sigma sampling on a set of data samples, wherein sufficiency for the data samples as input to the scaled-sigma sampling is based on (i) whether a threshold number of scaling factors have failures in the set of data samples and (ii) the failure boundary classification, in which the scaled-sigma sampling produces the yield estimate for the circuit design;
      if the data samples are insufficient, determine whether a yield is high enough to meet a yield target based on (i) a threshold number of the scaling factors not having failures and (ii) the failure boundary being classified as one of linear or super-linear; and extract corners associated with design instances that fail to meet a particular design specification based on the yield estimate and the yield target.

12. The system of claim 11, wherein the instructions cause the one or more processors to:

generate the first set of failure rate data and the reference set of failure rate data from the data samples by shifting a performance target such that a threshold number of failures occur at sigma equals one.

13. The system of claim 11, wherein the instructions cause the one or more processors to:

generate the reference set of failure rate data from the data samples based on a linear model.

14. The system of claim 13, wherein the comparing includes computing a difference between the first set of failure rate data and the reference set of failure rate data, and wherein the failure boundary is classified based on the difference.

15. The system of claim 14, wherein the failure boundary is classified as super-linear if the difference is large and most elements in the first set of failure rate data are larger than their corresponding elements in the reference set of failure rate data.

16. The system of claim 14, wherein the failure boundary is classified as sub-linear if the difference is large and most elements in the first set of failure rate data are smaller than their corresponding elements in the reference set of failure rate data.

17. The system of claim 11, wherein the instructions cause the one or more processors to:

if the failure boundary is super-linear, eliminate data samples for scaling factors where a failure rate does not increase significantly compared to a previous scaling factor.

18. The system of claim 11, wherein the corner extraction includes:

perform a binary search to locate a best performance target for a specified sigma value for corner creation, wherein scaled-sigma sampling is applied to estimate a yield corresponding to each candidate performance target, wherein the binary search terminates when the yield is sufficiently close to the specified sigma value, and wherein the best performance target is the candidate performance target at termination of the binary search.

19. The system of claim 18, wherein the instructions cause the one or more processors to:

identify a design corner by locating a design point with performance that best matches the best performance target.

20. A non-transitory computer readable medium containing program instructions for generating a yield estimate for a circuit design, wherein execution of the program instructions by one or more processors of a computer system causes the one or more processors to perform the following:

comparing a first set of failure rate data to a reference set of failure rate data, wherein each of the first set of failure rate data and the reference set of failure rate data includes failure rates for the circuit design at different scaling factors;

classifying a failure boundary based on the comparing, wherein the failure boundary is classified as one of linear, super-linear, and sub-linear;

selectively performing a scaled-sigma sampling on a set of data samples, wherein sufficiency for the data samples as input to the scaled-sigma sampling is based on (i) whether a threshold number of scaling factors have failures in the set of data samples and (ii) the failure boundary classification, in which the scaled-sigma sampling produces the yield estimate for the circuit design;

if the data samples are insufficient, determining whether a yield is high enough to meet a yield target based on (i) a threshold number of the scaling factors not having failures and (ii) the failure boundary being classified as one of linear or super-linear;

verifying the circuit design based on one of the yield estimate and the yield target; and causing a fabrication of an integrated circuit based at least in part on the verification of the circuit design.

* * * * *